(12) United States Patent
Tada

(10) Patent No.: US 6,465,872 B2
(45) Date of Patent: Oct. 15, 2002

(54) SEMICONDUCTOR DEVICE

(75) Inventor: Yuji Tada, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/753,883

(22) Filed: Jan. 3, 2001

(65) Prior Publication Data

US 2001/0015476 A1 Aug. 23, 2001

(30) Foreign Application Priority Data

Jan. 24, 2000 (JP) ........................................ 2000-014373

(51) Int. Cl.[7] ............................................ H01L 23/544
(52) U.S. Cl. ......................... 257/620; 257/734; 438/462
(58) Field of Search ................................ 438/462, 466; 257/622, 620, 734, 48; 372/46

(56) References Cited

U.S. PATENT DOCUMENTS

| | | | | |
|---|---|---|---|---|
| 4,692,927 A | * | 9/1987 | Sawai et al. | 372/46 |
| 5,477,062 A | * | 12/1995 | Natsume | 257/48 |
| 5,608,264 A | * | 3/1997 | Gaul | 257/734 |
| 5,925,924 A | * | 7/1999 | Cronin et al. | 257/622 |
| 6,214,703 B1 | * | 4/2001 | Chen et al. | 438/462 |

FOREIGN PATENT DOCUMENTS

| | | |
|---|---|---|
| EP | 0 828 288 | 3/1998 |
| JP | 64-050542 | 2/1989 |
| JP | 1-199434 | 8/1989 |
| JP | 2-45955 | 2/1990 |
| JP | 6-77315 | 3/1994 |
| JP | 06-077315 | * 3/1994 ........... H01L/21/78 |
| JP | 6-151583 | 5/1994 |
| JP | 07-014806 | 1/1995 |
| JP | 08-172062 | 7/1996 |
| JP | 09-260309 | 10/1997 |

* cited by examiner

Primary Examiner—David Nelms
Assistant Examiner—Thinh Nguyen

(57) ABSTRACT

A semiconductor device has a semiconductor substrate (1) having a plurality of individual semiconductor device areas (10-1, 10-2), and a scribe area (20) positioned between the individual semiconductor device areas (10-1, 10-2) adjacent to each other so as to extend along peripheral edges of the adjacent individual semiconductor device areas (10-1, 10-2); an interlayer insulating film (2a) formed on the semiconductor substrate (1); a passivation film (6a) formed on the interlayer insulating film (2a); a protection film (7, 7a-1, 7a-2) formed on the passivation film (6a). The protection film (7a-1, 7a-2) in the scribe area (20) is constituted by a plurality of first side scribe area protection film patterns (7a-1) formed so as to be continuous with the protection film (7) of one of the adjacent individual semiconductor device area (10-1) while being arranged in a direction of the scribe area (20), and a plurality of second side scribe area protection film patterns (7a-2) formed so as to be continuous with the protection film (7) of the other of the adjacent individual semiconductor device area (10-2) while being arranged in the direction of the scribe area (20). Both the first side scribe area protection film patterns (7a-1) and second side scribe area protection film patterns (7a-2) are isolated from a center line (CL) of the scribe area (20) so as to be in axially symmetrical arrangement with respect to the center line (CL).

9 Claims, 7 Drawing Sheets

SEMICONDUCTOR DEVICE

BACKGROUND OF THE INVENTION

1. Field of the Invention

The present invention relates to a semiconductor device, and particularly to an improvement of the structure of a scribe area of the semiconductor device.

2. Description of the Related Art

In a semiconductor device manufacturing process using a silicon substrate or compound semiconductor substrate, a semiconductor wafer having many individual semiconductor devices formed on the substrate is divided into plural semiconductor chips of individual semiconductor devices by using a dicing saw or the like. An area in which the wafer is divided is called as a scribe area, and the surface of the substrate is normally exposed to the outside in the scribe area.

FIGS. 7A and 7B are plan view and cross-sectional view showing the structure of each scribe area of a wafer or semiconductor device and its peripheral portion as disclosed in JP-1-199434(A) or the like.

As shown in FIGS. 7A and 7B, in the conventional semiconductor device, an interlayer insulating film 2a such as BPSG film or silicon oxide film is formed on a substrate 1, and a passivation film 6a made of an inorganic insulating film of SiON, SiN or the like is formed on the interlayer insulating film 2a to protect the semiconductor device from humid air or corrosive gas. Further, a protection film 7 made of photosensitive or non-photosensitive polyimide resin is formed on the passivation film 6a to buff mechanical stress such as vibration, impact or the like on the substrate and to protect the semiconductor device from environmental humidity.

Reference numeral 10 represents an individual semiconductor device area or semiconductor chip area, and reference numeral 20 represents a scribe area surrounding each semiconductor chip area 10 while being positioned between the neighboring chip areas 10 and extending along the peripheral edge of the neighboring chip areas 10. The scribe area 20 is formed by exposing the surface of the substrate 1 to the outside to divide the wafer into individual semiconductor devices or semiconductor chips. In order to divide the wafer into semiconductor chips, the substrate 1 is scratched or incised along the scribe area 20 with a scriber or dicing saw, and then the principal surface of the substrate 1 is pressed to divide the wafer into individual chips.

In the structure of the scribe area as shown in FIGS. 7A and 7B, however, cracks or fractures which extend to the peripheral portion of the semiconductor chip areas 10 occur on the substrate 1 when the wafer is divided into chips, and thus there occurs such a problem that corners of the individual semiconductor devices are chipped. Further, a semiconductor device characteristics estimating element (not shown) formed in the scribe area is influenced by moisture absorption or the like because the surface of the substrate is exposed to the outside and thus the characteristics of the estimating element are varied, so that the characteristics estimation of the semiconductor device is degraded in reliability.

A method of solving the above problems has been disclosed or suggested in JP-2-45955(A), JP-6-151583(A) and JP-6-77315(A).

The structure of the scribe area disclosed or suggested in JP-2-45955(A) or JP-6-151583(A) will be described with reference to FIGS. 5A and 5B. FIG. 5A is a plan view showing the scribe area, and FIG. 5B is a cross-sectional view taken along A–A' of FIG. 5A.

As shown in FIGS. 5A and 5B, an interlayer insulating film 2a of a silicon oxide film or the like is formed on the surface of the substrate 1, and a passivation film 6a of a silicon nitride (SiN) film or the like is formed on the interlayer insulating film 2a to protect an estimating element (not shown) formed in a scribe area 20. A rectangular protection film (referred to as "scribe area protection film pattern") 7c is formed on the passivation film 6a in the scribe area 20 by a patterning treatment at the same time when a protection film 7 made of organic resin such as polyimide resin or the like is formed on the passivation film 6a in the semiconductor chip area 10 by the patterning treatment. The scribe area protection film pattern 7c is formed so as to protect the estimating element formed in the scribe area 20 and also so that cracks occurring in the substrate at the scribe area during a dicing work for the scribe area after an estimation has been made with the estimating element is prevented from expanding to the semiconductor chip areas 10.

According to JP-6-77315(A), as shown in FIGS. 6A and 6B, it is suggested that a scribe area protection film pattern 7d is disposed in a scribe area 20 so as to be continuous with a protection film 7 of the semiconductor chip area 10 at one side so that cracks occurring in the substrate 1, etc. at the scribe area 20 can be suppressed from expanding to the semiconductor chip areas 10 during the dicing work for the scribe area.

In the technique of forming the protection film pattern of polyimide resin or the like in the scribe area as shown in FIGS. 5A and 5B and FIGS. 6A and 6B, there can be obtained an effect of suppressing the expansion of cracks to the semiconductor chip areas during the dicing work, however, there may occur such a disadvantage that the back surfaces of the semiconductor chips are chipped or a part of the protection film pattern 7c, 7d in the scribe area may remain like beards after the dicing work. Further, this disadvantage also causes reduction of the lifetime of dicing blades.

It is estimated that in the technique of forming the protection film pattern of polyimide resin or the like in the scribe area as shown in FIGS. 5A and 5B and FIGS. 6A and 6B, a larger amount of polyimide resin adheres to the dicing blade as the dicing blade is used for a longer time, so that the dicing efficiency of the dicing blade is lowered and bearded polyimide resin and cracks on the back surfaces of the semiconductor chips are liable to occur.

SUMMARY OF THE INVENTION

An object of the present invention is to provide a semiconductor device for which remaining of bearded polyimide resin after a dicing operation and occurrence of cracks on the back surface of an individual semiconductor chip can be suppressed in a semiconductor device dicing process, and particularly to provide the structure of a scribe area of the semiconductor device.

Further, another object of the present invention is to provide a semiconductor device which can enhance the lifetime of a dicing blade in a dicing process of a semiconductor device having a protection film of polyimide resin.

In order to attain the above objects, according to the present invention, there is provided a semiconductor device, comprising a semiconductor substrate having a plurality of individual semiconductor device areas, and a scribe area positioned between the individual semiconductor device areas adjacent to each other so as to extend along peripheral edges of the adjacent individual semiconductor device areas; an interlayer insulating film formed on the semiconductor substrate; a passivation film formed on the interlayer insulating film; and, a protection film formed on the passivation film, wherein the protection film in the scribe area comprises a plurality of first side scribe area protection film patterns formed so as to be continuous with the protection film of one of the adjacent individual semiconductor device areas while being arranged in a direction of the scribe area, and a plurality of second side scribe area protection film patterns formed so as to be continuous with the protection film of the other of the adjacent individual semiconductor device areas while being arranged in the direction of the scribe area, and, both said first side scribe area protection film patterns and second side scribe area protection film patterns are isolated from a center line of the scribe area.

The first side scribe area protection film patterns and second side scribe area protection film patterns may be in axially symmetrical arrangement or in staggered arrangement with respect to the center line of the scribe area.

The interval between the first side scribe area protection film patterns and second side scribe area protection film patterns may be set to 20 to 30% of a width of said scribe area or to 20 to 30 $\mu$m.

The shape of the first side scribe area protection film patterns and second side scribe area protection film patterns may be a rectangular, trapezoidal or semicircular shape.

The protection film may be a photosensitive or non-photosensitive polyimide film. The passivation film may be an SiN film or SiON film.

In the scribe area, an alignment mark and/or device characteristics estimating element may be provided.

According to the present invention, the layout of the protection film on the scribe area is set so as to form a plurality of first side scribe area protection film patterns which are continuous with the protection film of one of the adjacent individual semiconductor device areas while being arranged in a direction of the scribe area, and a plurality of second side scribe area protection film patterns which are continuous with the protection film of the other of the adjacent individual semiconductor device areas while being arranged in the direction of the scribe area, for example in an axially symmetrical arrangement or in a staggered arrangement with respect to the center line of the scribe area. With this layout of the protection film on the scribe area, the adhesion of the protection film to a dicing blade can be suppressed to enhance the dicing efficiency and prevent remaining of bearded protection film of polyimide resin and cracks of the back surface of the device area after the dicing operation. Further, since the dicing blade can be prevented from being clogged with the protection film, and thus the lifetime of the blade can be enhanced.

DETAILED DESCRIPTION OF THE PREFERRED EMBODIMENTS

Preferred embodiments according to the present invention will be described hereunder with reference to the accompanying drawings.

Figure 1A:
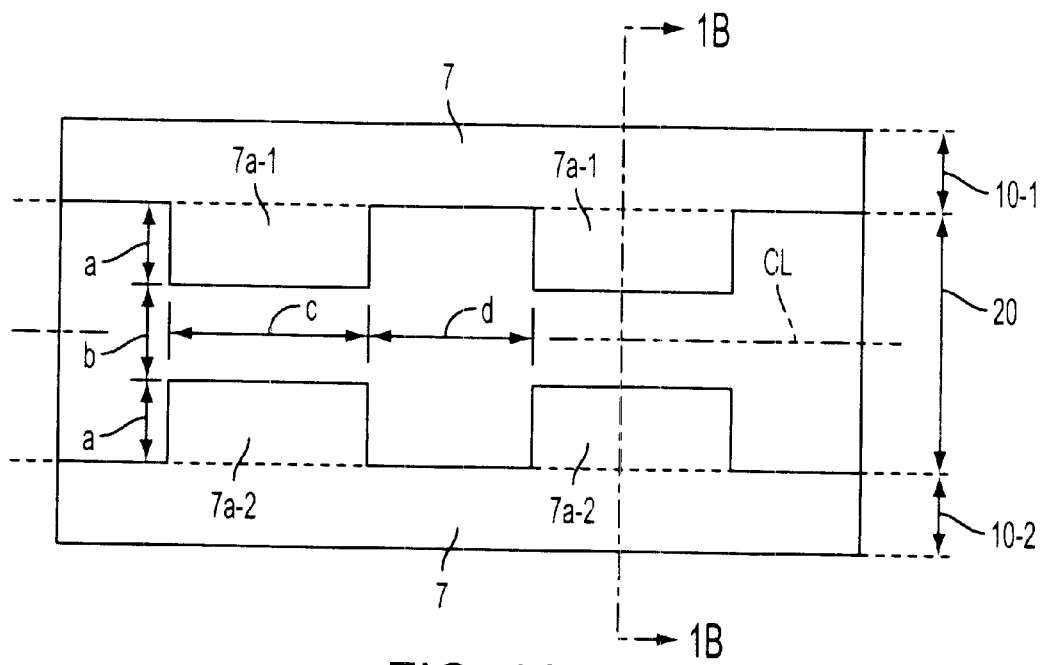
FIGS. 1A and 1B are plan view and cross-sectional view showing a scribe area and semiconductor chip areas adjacent to the scribe area in a semiconductor device according to a first embodiment of the present invention.
Figure 1B:
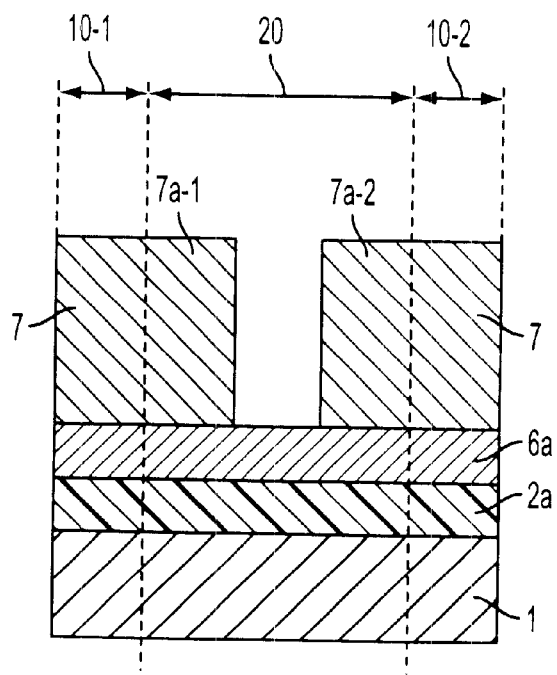

FIGS. 1A and 1B are plan view and cross-sectional view showing the main part of a scribe area and semiconductor chip areas adjacent to the scribe area in a semiconductor device according to a first embodiment of the present invention.

As shown in FIGS. 1A and 1B, a semiconductor device according to the first embodiment of the present invention has an interlayer insulating film 2a of BPSG (Boron-phosphosilicate Glass), $SiO_2$ or the like formed on a substrate 1 on which semiconductor elements (not shown) for each individual semiconductor device are formed, a wiring layer (not shown) formed on the interlayer insulating film 2a and a passivation film 6a of SiN, SiON or the like for protecting the semiconductor elements. Further, a protection film 7 of photosensitive or non-photosensitive polyimide film or the like is formed on the passivation film 6a to protect the individual semiconductor chip from mechanical impacts and humidity. Each scribe area 20 is provided between the neighboring semiconductor chip areas 10-1, 10-2 (in other words, a scribe area 20 is provided around each semiconductor chip area 10-1, 10-2, . . . , and it is diced to divide the wafer substrate into the individual semiconductor chips.

A first side scribe area protection film patterns 7a-1 made of the same material as the protection films 7 are formed by patterning so as to be continuous with the protection film 7 of a first side semiconductor chip area 10-1 simultaneously with the formation of the protection films 7. A second side scribe area protection film patterns 7a-2 made of the same material as the protection films 7 are also formed by patterning so as to be continuous with the protection film 7 of a second side semiconductor chip area 10-2 simultaneously with the formation of the protection films 7. The first and second sides scribe area protection film patterns 7a-1, 7a-2 are each arranged along the peripheral edges of the first and second sides semiconductor chip areas 10-1, 10-2, respectively, with the interval "d".

More specifically, the scribe area protection film patterns 7a-1, 7a-2 are patterned so as to be axially symmetrical with respect to the center line CL of the scribe area 20 so that the axially symmetrical patterns 7a-1, 7a-2 are kept at a predetermined distance (interval) indicated by "b". The dimension "c" of each scribe area protection film pattern 7a-1, 7a-2 in the scribe line direction is suitably set in conformity with the size of a semiconductor chip characteristics estimating element (not shown) or the like formed on the surface of the substrate 1 in the scribe area. The distance b between the corresponding scribe area protection film patterns 7a-1, 7a-2 is preferably set to 20 to 30 µm.

Since the width of the scribe area 20 is normally set to about 100 µm, the dimension "a" of each of the scribe area protection film patterns 7a-1, 7a-2 in the direction perpendicular to the scribe line direction is equal to 35 to 40 µm. The above distance b of 20 to 30 µm is 20 to 30% of the width of the scribe area 20. Further, the interval d of the neighboring first or second side scribe area protection film patterns 7a-1, 7a-2 in the scribe line direction is preferably set to 25 µm or more.

According to the first embodiment, an area having no protection film is provided at the center portion extending in the scribe line direction along the center line or central axis CL to have a width of 20 to 30 µm, and the scribe area protection film patterns 7a-1, 7a-2 are designed to be axially symmetrical with respect to the center line CL of the scribe area 20, thereby reducing the adhesion of the protection film to the dicing blade in the dicing work and thus enhancing the dicing efficiency. Therefore, occurrence of cracks in the substrate 1 at the scribe area 20 and small chipping on the back surfaces of the semiconductor chip areas adjacent to the scribe area can be prevented, and also the protection films 7 adjacent to the scribe area can be prevented from being peeled during the dicing work.

Next, a semiconductor device according to a second embodiment of the present invention will be described with reference to the accompanying drawings.

Figure 2A:
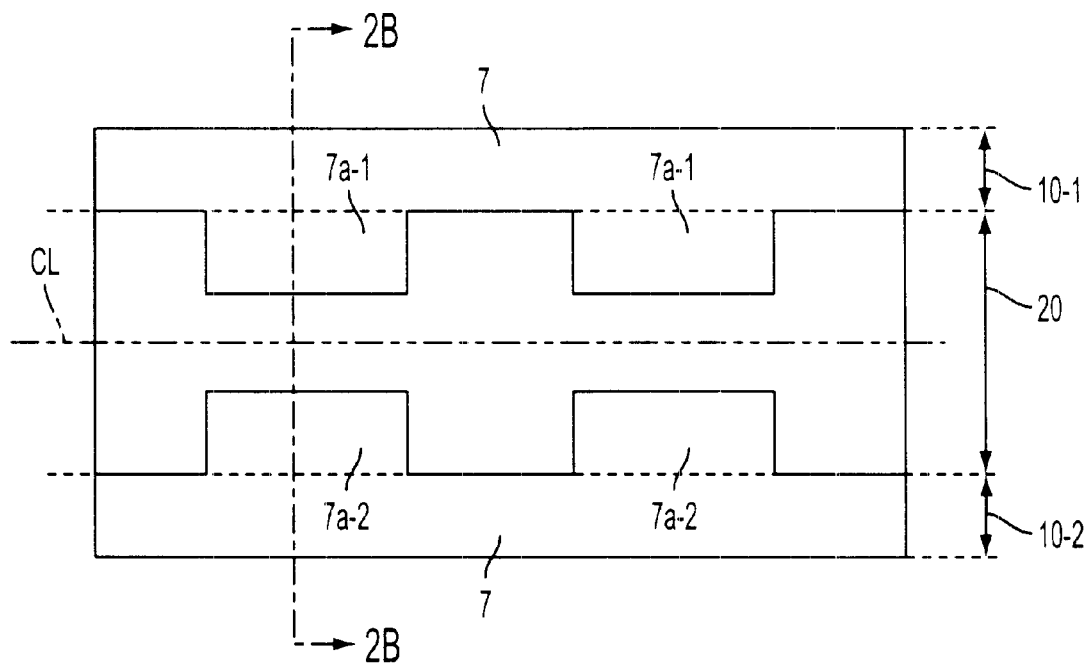
FIGS. 2A and 2B are plan view and cross-sectional view showing a scribe area and semiconductor chip areas adjacent to the scribe area in a semiconductor device according to a second embodiment of the present invention.
Figure 2B:
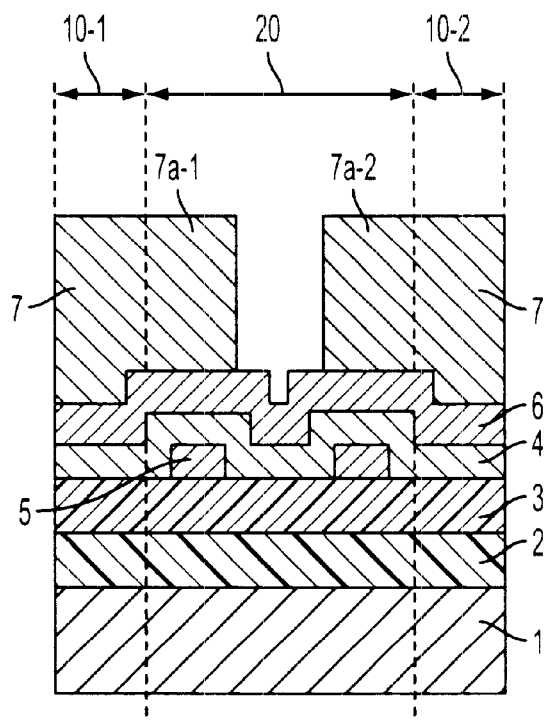

FIGS. 2A and 2B are plan view and cross-sectional view showing the main part of a scribe area and semiconductor chip areas adjacent to the scribe area in a semiconductor device according to a second embodiment of the present invention. In this embodiment, alignment marks 5 made of metal film of aluminum or the like are provided in the scribe area 20.

As shown in FIGS. 2A and 2B, the semiconductor device of this embodiment has a first interlayer insulating film 2 of BPSG or the like formed on a substrate 1 on which semiconductor elements (not shown) are formed, a second interlayer insulating film 3 of $SiO_2$ or the like formed on the first interlayer insulating film 2, a wiring layer (not shown) formed on the second interlayer insulating film 3, a first passivation film 4 of $SiO_2$ or the like formed on the wiring layer, and a second passivation film 6 of SiN, SiON or the like formed on the first passivation film 4 for protecting the individual semiconductor devices. Further, a protection film 7 of a photosensitive or non-photosensitive polyimide film or the like is formed on the second passivation film 6 to protect the individual semiconductor chip from mechanical impacts and humidity. A scribe area 20 is provided between the neighboring semiconductor chip areas 10-1, 10-2, and the scribe area 20 is diced to divide the wafer substrate into the individual semiconductor chips.

Alignment marks 5 made of metal such as aluminum or the like which are formed by patterning together with the wiring layer (not shown) of the semiconductor chip areas 10-1, 10-2 are formed on the second interlayer insulating film 3 at the scribe area 20, and scribe area protection film patterns 7a-1, 7a-2 which are formed by patterning together with the protection films 7 of the semiconductor chip areas 10-1, 10-2 and made of the same material as the protection films 7 are provided so as to be continuous with the protection films 7 of the semiconductor chip areas 10-1, 10-2. A semiconductor chip characteristics estimating element (not shown) may be provided on the surface of the substrate 1 at the scribe area 20.

The shape and size of the scribe area protection film patterns 7a-1, 7a-2 may be the same as the first embodiment.

Next, a semiconductor device according to a third embodiment of the present invention will be described with reference to FIGS. 3A and 3B.

Figure 3A:
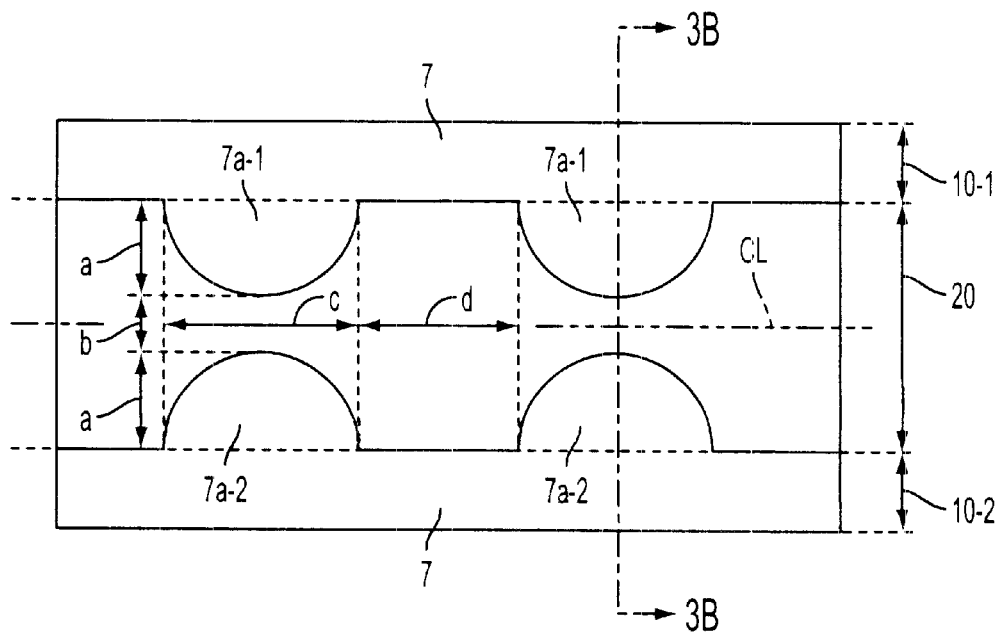
FIGS. 3A and 3B are plan view and cross-sectional view showing a scribe area and semiconductor chip areas adjacent to the scribe area in a semiconductor device according to a third embodiment of the present invention.
Figure 3B:
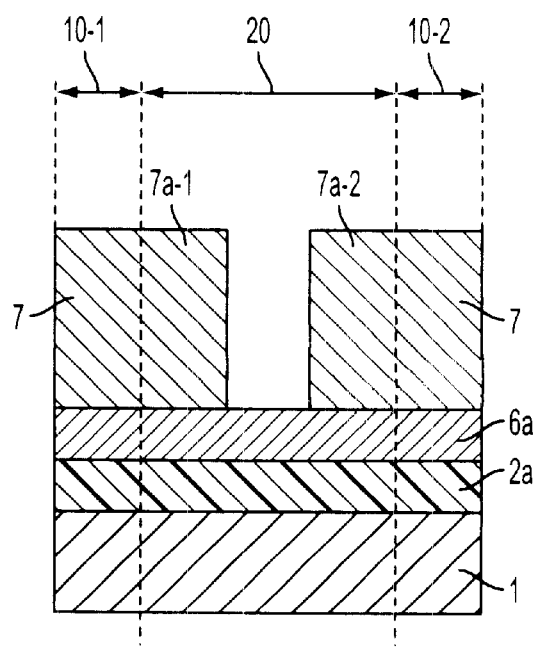

FIGS. 3A and 3B are plan view and cross-sectional view showing the main part of a scribe area and semiconductor chip areas adjacent to the scribe area in a semiconductor device according to a third embodiment of the present invention.

In this embodiment, the rectangular shape of each scribe area protection film pattern 7a-1, 7a-2 at the scribe area 20 in the first embodiment is changed to a semicircular shape or the like, and the semiconductor device manufacturing method and the scribe area forming method are the same as the first embodiment. In the third embodiment, by changing the rectangular shape of each scribe area protection film pattern 7a-1, 7a-2 to the semicircular shape or the like, the scribe area protection film patterns 7a-1, 7a-2 are more hardly peeled during the dicing work for the scribe area 20, and further the effect of preventing the peeling of the protection films 7 in the semiconductor chip areas can be more enhanced.

The sizes "a" to "d" of the scribe area protection film patterns 7a-1, 7a-2 may be the same as the first embodiment.

Next, a semiconductor device according to a fourth embodiment of the present invention will be described with reference to FIGS. 4A and 4B.

Figure 4A:
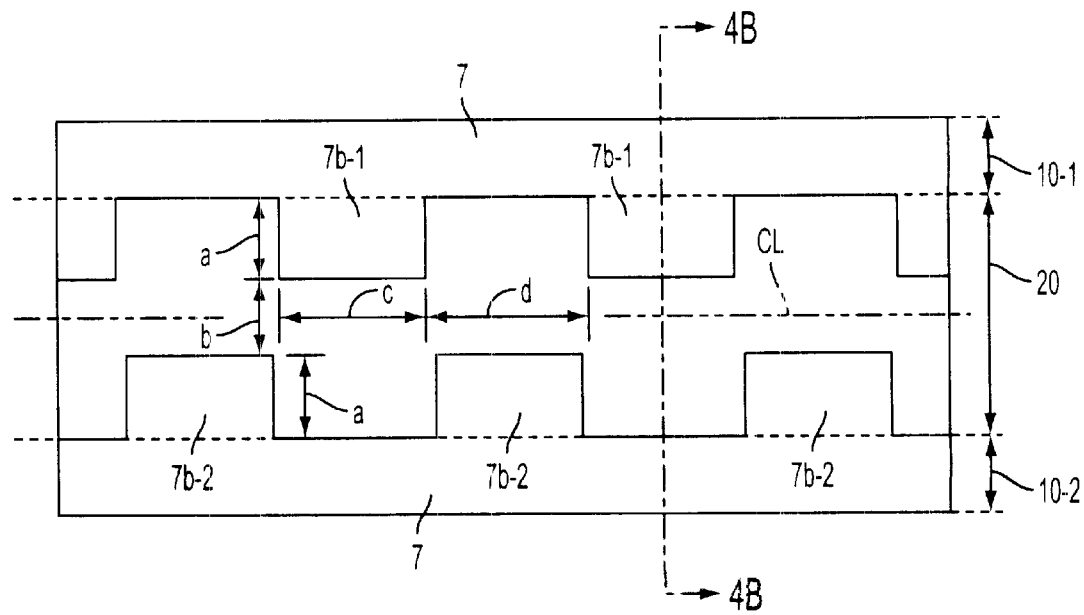
FIGS. 4A and 4B are plan view and cross-sectional view showing a scribe area and semiconductor chip areas adjacent to the scribe area in a semiconductor device according to a fourth embodiment of the present invention.
Figure 4B:
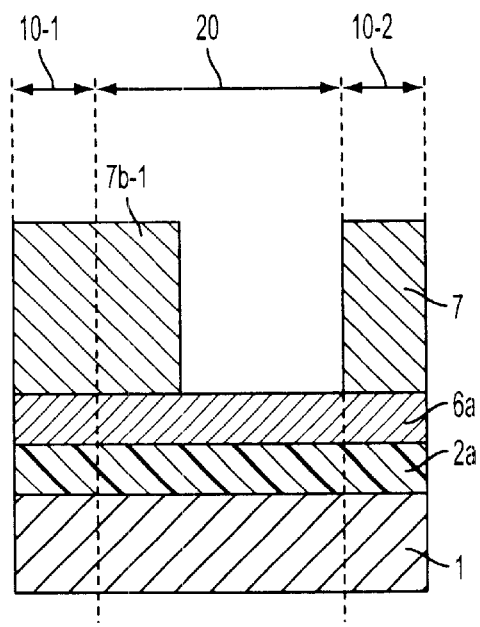
Figure 5A:
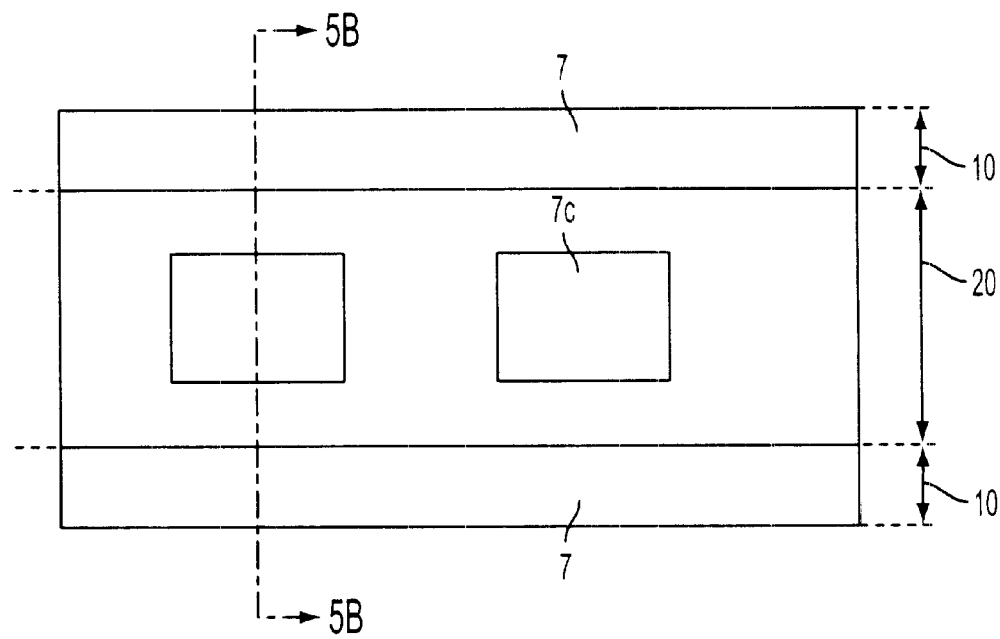
FIGS. 5A and 5B are plan view and cross-sectional view showing a scribe area and semiconductor chip areas adjacent to the scribe area in a semiconductor device.
Figure 5B:
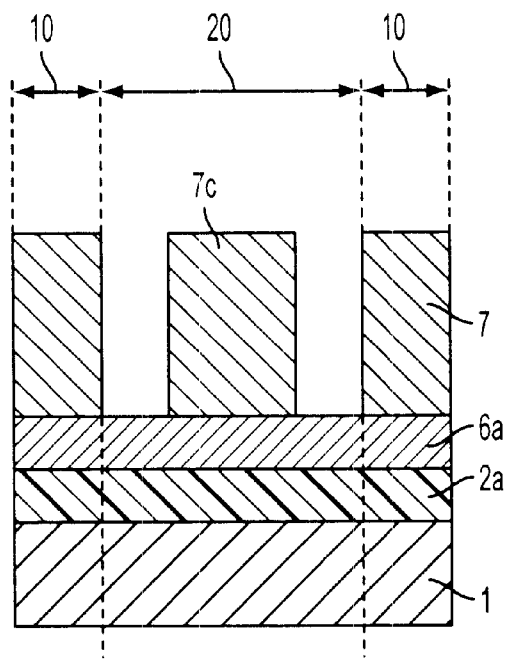
Figure 6A:
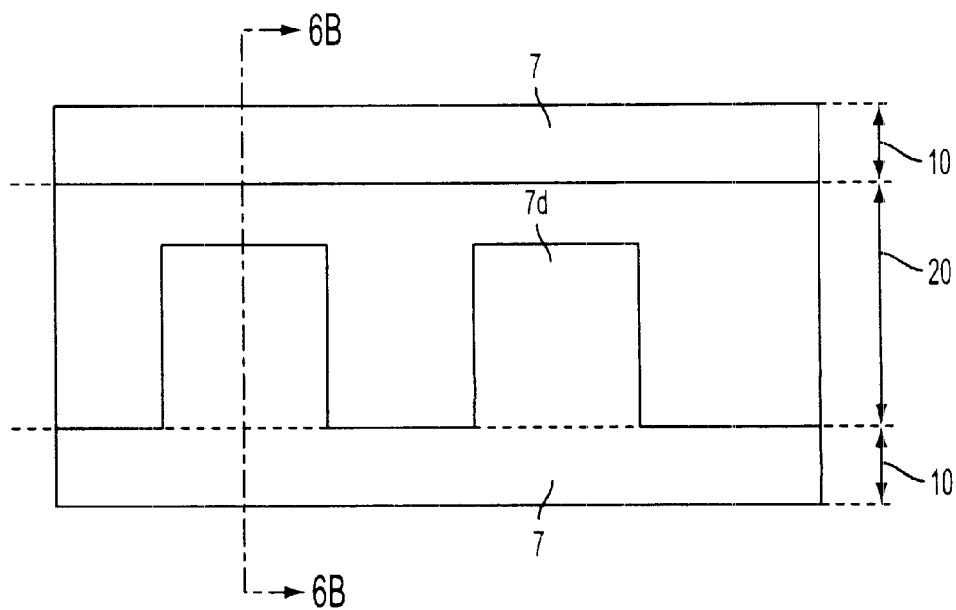
FIGS. 6A and 6B are plan view and cross-sectional view showing a scribe area and semiconductor chip areas adjacent to the scribe area in a semiconductor device.
Figure 6B:
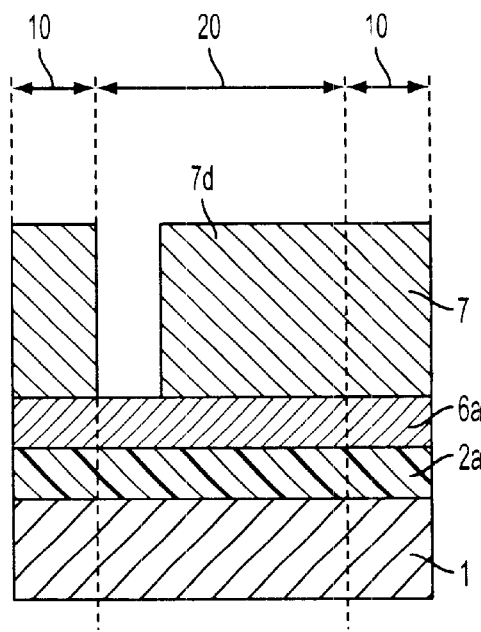
Figure 7A:
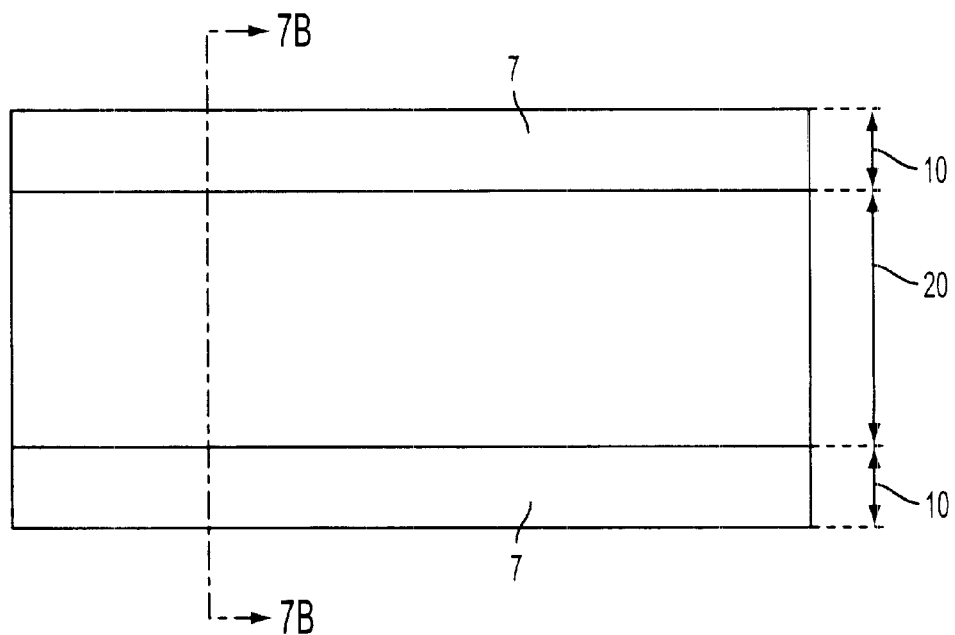
FIGS. 7A and 7B are plan view and cross-sectional view showing a scribe area and semiconductor chip areas adjacent to the scribe area in a semiconductor device.
Figure 7B:
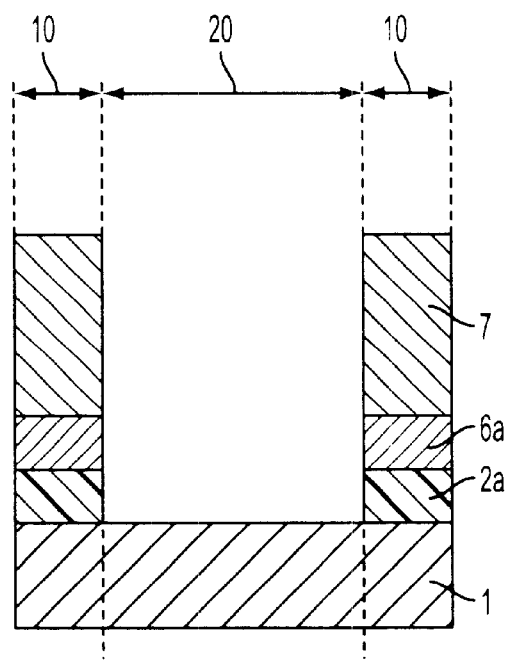

FIGS. 4A and 4B are plan view and cross-sectional view showing the main part of a scribe area and semiconductor chip areas adjacent to the scribe area in the semiconductor device of the fourth embodiment.

As shown in FIGS. 4A and 4B, a semiconductor device according to this embodiment of the present invention has an interlayer insulating film 2a of BPSG, $SiO_2$ or the like formed on a substrate 1 on which semiconductor elements (not shown) for each individual semiconductor devices are formed, a wiring layer (not shown) formed on the interlayer insulating film 2a and a passivation film 6a of SiN, SiON or the like for protecting the individual semiconductor devices. Further, a protection film 7 of photosensitive or non-photosensitive polyimide film or the like is formed on the passivation film 6a to protect an individual semiconductor chip from mechanical impacts and humidity. A scribe area 20 is provided between the neighboring semiconductor chip areas 10-1, 10-2, and the scribe area 20 is diced to divide the wafer substrate into the individual semiconductor chips.

A first side scribe area protection film patterns 7b-1 made of the same material as the protection films 7 are formed by patterning so as to be continuous with the protection film 7 of a first side semiconductor chip area 10-1 simultaneously with the formation of the protection films 7. A second side scribe area protection film patterns 7b-2 made of the same material as the protection films 7 are also formed by patterning so as to be continuous with the protection film 7 of a second side semiconductor chip area 10-2 simultaneously with the formation of the protection films 7. The first and second sides scribe area protection film patterns 7b-1, 7b-2 are each arranged along the peripheral edges of the first and second sides semiconductor chip areas 10-1, 10-2, respectively, with the interval "d".

More specifically, the scribe area protection film patterns 7b-1, 7b-2 are patterned so as to be in a staggered arrangement with respect to the center line CL of the scribe area at a predetermined distance (interval) indicated by "b". The dimension "c" of each scribe area protection film pattern 7b-1, 7b-2 in the scribe line direction is suitably set in conformity with the size of a semiconductor chip characteristics estimating element (not shown) or the like formed on the surface of the substrate 1 in the scribe area, as in the case of the above embodiments. The distance b is preferably set to 20 to 30 μm.

Since the width of the scribe area 20 is normally set to about 100 μm, the dimension "a" of each of the scribe area protection film patterns 7b-1, 7b-2 in the direction perpendicular to the scribe line direction is equal to 35 to 40 μm. The above distance b of 20 to 30 μm is 20 to 30% of the width of the scribe area 20. Further, the interval d of the neighboring first or second side scribe area protection film patterns 7b-1, 7b-2 in the scribe line direction is preferably set to 25 μm or more.

According to this embodiment, an area having no protection film is provided at the center portion extending in the scribe line direction along the center line or central axis CL to have a width of 20 to 30 μm, and the scribe area protection film patterns 7b-1, 7b-2 are designed to be in the staggered arrangement with respect to the center line CL of the scribe area 20, thereby reducing the adhesion of the protection film to the dicing blade in the dicing work and thus enhancing the dicing efficiency. Therefore, occurrence of cracks in the substrate 1 at the scribe area 20 small chipping on the back surfaces of the semiconductor chip areas adjacent to the scribe area and remaining of bearded protection film can be prevented, and also the protection films 7 adjacent to the scribe area can be prevented from being peeled during the dicing work.

In addittion, by providing the scribe area protection film patterns 7b-1, 7b-2 in the staggered arrangement, the patterning of the scribe area protection film patterns 7b-1, 7b-2 can be more easily performed as compared with the first to third embodiments.

In the above embodiments, the shape of the scribe area protection film pattern is set to a rectangular or semicircular shape, however, the same effect may be obtained even when the trapezoidal shape is adopted therefor.

As described above, according to the present invention, the following effects can be achieved by providing the first and second sides protection film pattern of polyimide film or the like in the scribe area of the semiconductor wafer so as to be in an axially symmetrical arrangement or staggered arrangement with respect to the center line of the scribe area at a predetermined interval and so as to be continuous with the protection films of the first and second sides semiconductor chip areas:

(1) In the dicing step of the semiconductor wafer, adhesion of the protection film to the dicing blade is suppressed, so that the dicing efficiency is enhanced, and chipping of the back surfaces of the semiconductor chips and occurrence of remaining of bearded protection film (polyimide film) after the dicing work can be prevented.

(2) Since the adhesion of the protection film to the dicing blade is suppressed, the dicing blade can be prevented from being clogged with the protection film, and thus the lifetime of the dicing blade can be enhanced.

What is claimed is:

1. A semiconductor device, comprising:
a semiconductor substrate having a plurality of individual semiconductor device areas, and a scribe area positioned between said individual semiconductor device areas adjacent to each other so as to extend along peripheral edges of the adjacent individual semiconductor device areas;
an interlayer insulating film formed on said semiconductor substrate;
a passivation film formed on said interlayer insulating film; and,
a protection film formed on said passivation film, wherein said protection film in said scribe area comprises a plurality of first side scribe area protection film patterns formed so as to be continuous with said protection film of one of said adjacent individual semiconductor device areas while being arranged in a direction of said scribe area at intervals, and a plurality of second side scribe area protection film patterns formed so as to be continuous with said protection film of the other of said adjacent individual semiconductor device areas while being arranged in a direction of said scribe area at intervals, and, both said first side scribe area protection film patterns and said second side scribe area protection film patterns are isolated from a center line of said scribe area.

2. The semiconductor device as claimed in claim 1, wherein said first side scribe area protection film patterns and second side scribe area protection film patterns are in axially symmetrical arrangement with respect to the center line of said scribe area.

3. The semiconductor device as claimed in claim 1, wherein said first side scribe area protection film patterns and second side scribe area protection film patterns are in staggered arrangement with respect to the center line of said scribe area.

4. The semiconductor device as claimed in claim 1, wherein an interval between said first side scribe area protection film patterns and second side scribe area protection film patterns is set to 20 to 30% of a width of said scribe area.

5. The semiconductor device as claimed in claim 1, wherein an interval between said first side scribe area protection film patterns and second side scribe area protection film patterns is set to 20 to 30 μm.

6. The semiconductor device as claimed in claim 1, wherein a shape of said first side scribe area protection film patterns and second side scribe area protection film patterns is a rectangular, trapezoidal or semicircular shape.

7. The semiconductor device as claimed in claim 1, wherein said protection film is a photosensitive or non-photosensitive polyimide film.

8. The semiconductor device as claimed in claim 1, wherein said passivation film is an SiN film or SiON film.

9. The semiconductor device as claimed in claim 1, wherein an alignment mark and/or device characteristics estimating element is provided in said scribe area.

* * * * *